United States Patent [19]

Takagi et al.

[11] Patent Number: 4,931,692
[45] Date of Patent: Jun. 5, 1990

[54] LUMINESCING MEMBER, PROCESS FOR PREPARATION THEREOF, AND ELECTROLUMINESCENT DEVICE EMPLOYING SAME

[75] Inventors: Hiroshi Takagi, Yokohama; Kazuaki Ohmi, Hadano; Masao Sugata, Yokohama; Hisanori Tsuda, Atsugi; Takahiko Ishiwatari, Yamato, all of Japan

[73] Assignee: Canon Kabushiki Kaisha, Tokyo, Japan

[21] Appl. No.: 256,472

[22] Filed: Oct. 12, 1988

[30] Foreign Application Priority Data

Oct. 14, 1987 [JP] Japan .............................. 62-258792
Oct. 14, 1987 [JP] Japan .............................. 62-258794
Oct. 14, 1987 [JP] Japan .............................. 62-258798
Oct. 14, 1987 [JP] Japan .............................. 62-258799

[51] Int. Cl.$^5$ .......................................... H05B 33/14
[52] U.S. Cl. .................................. 313/503; 313/498; 428/690; 428/917
[58] Field of Search ...................... 313/499, 498, 503; 428/690, 917

[56] References Cited

U.S. PATENT DOCUMENTS 4,486,499 12/1984 Morimoto ....................... 313/499 X

OTHER PUBLICATIONS

App. Phys. Lett., vol. 35, No. 12, (12/1979) 937:9.
App. Phys. Lett., vol. 42, No. 4 (12/1983) 369:71.
Chem. Abs., vol. 105, No. 14 (12/1986) 123447v.

*Primary Examiner*—Kenneth Wieder
*Attorney, Agent, or Firm*—Fitzpatrick, Cella, Harper & Scinto

[57] ABSTRACT

A luminescing member emits light as a result of application of excitation energy thereto, wherein a luminescing part comprises on ultrafine particle film formed by deposition of ultrafine particles. It is preferred that the ultrafine particles comprises an amorphous A:Ox or an amorphous A:O:H having an A—O—A bond and an A—OH bond, and the element A is at least one element selected from the group consisting of Si, C and Ge.

49 Claims, 8 Drawing Sheets

LUMINESCING MEMBER, PROCESS FOR PREPARATION THEREOF, AND ELECTROLUMINESCENT DEVICE EMPLOYING SAME

BACKGROUND OF THE INVENTION

1. Field of the Invention

The present invention relates to a novel luminescing or light-emitting member that emits visible fluorescence or phosphorescence at room temperature upon the application of an electric field or absorption of excitation energy such as electron rays, X-rays and ultraviolet rays, as well as visible light rays and infrared rays. The present invention also relates to a process for preparing the same and to a novel electroluminescent device that can be applied to a light sources for lighting, display or office automation instruments.

2. Related Background Art

Various types of materials have hitherto been known as luminescing materials capable of emitting visible fluorescence or phosphoresce. For example, "Muki Hikarikagaku", Kagaku Sosetsu No. 39, pp. 210–204, 1983, Japan Chemical Society, discloses that ZnS:Ag/Cl, ZnS:Cu/Al, $Y_2O_2S:Eu^{3+}$, etc. are usable as a fluorescent substances for use in televisions, and ZnO, etc. when burnt in a reducing atmosphere, may be used a fluorescent substance in fluorescent display tubes.

ZnS fluorescent materials are also used as materials which form a luminescing layer of an electroluminescent device, see Oyo Butsuri, Vol. 51, No. 7, 1982.

Such a luminescing layer is formed as a vapordeposited layer by vapor deposition of ZnS on a substrate, or formed by coating a composition comprising powder of ZnS and an organic binder, which composition is produced by immersing the powder of ZnS in a $CuSO_4$ solution to lower its resistance, followed by dispersion in the organic binder.

On the other hand, as a material different from the above materials conventionally used, Appl. Phys. Lett. 42(4), 1983 discloses that a film of amorphous silicon (a-Si:$H_x$) emits visible light at room temperature.

This film is prepared by the HOMOCVD (homogeneous chemical vapor deposition) process using $SiH_4$ as a raw material. A film prepared at a film formation substrate temperature of 25° C. has an emission intensity as much as 215 times at room temperature to a $GaAs_{0.12}P_{0.87}$:N LED material.

However, the emission intensity of $GaAs_{0.12}P_{0.87}$:N in the visible region is originally very small. Therefore, even if the film prepared by HOMOCVD has the emission intensity of 215 times as compared with this, the intensity of the film is too small for practical use.

Moreover, although the HOMOCVD Method, (which is different from conventional CVD) is advantageous in that films can be formed at a film formation substrate temperature of room temperature, $SiH_4$ gas must still be heated to temperatures as high as 550° C. or more, so that it is disadvantageous in that a large energy is required and that the deposition rate is low.

SUMMARY OF THE INVENTION

An object of the present invention is to provide a novel luminescing member that can overcome the defects of the prior art emit visable light at room temperature, and have a large emission intensity.

Another object of the present invention is to provide a novel low temperature process for preparing a luminescing member which provides a luminescing member exhibiting a large emission intensity.

Still another object of the present invention is to provide an electroluminescent device (EL device) capable of obtaining a highly luminous emission with a low voltage drive.

The above objects is achieved by the present invention described below.

The present invention provides a luminescing member that emits light as a result of application of excitation energy thereto, wherein a luminescing part comprises an ultrafine particle film formed by deposition of ultrafine particles.

In a preferred embodiment, the present invention provides a luminescing member that emits light as a result of application of excitation energy thereto, wherein a luminescing part comprises ultrafine particles comprising an amorphous A:$O_x$, and said element A is at least one element selected from the group consisting of Si, C and Ge.

In a still preferred embodiment, the present invention provides a luminescing member that emits light as a result of application of excitation energy thereto, wherein a luminescing part comprises ultrafine particles comprising an amorphous A:O:H having an A-O-H bond and an A-OH bond, and said element A is at least one element selected from the group consisting of Si, C and Ge.

In another embodiment, the present invention provides a luminescing member prepared by forming ultrafine particles comprising an amorphous A:$H_x$ containing a large number of $AH_2$ bonds and oxidizing said ultrafine particles, said element A being at least one element selected from the group consisting of Si, C and Ge.

The present invention also provides a process for preparing a luminescing member, comprising the steps of subjecting a gas containing silane and its derivatives to a discharge plasma treatment to form ultrafine particles containing silicon, blowing a gas containing said ultrafine particles on a substrate through a nozzle to form on the substrate a deposit film comprising the ultrafine particles, and oxidizing said deposit film under the condition of a high humidity.

The present invention further provides an electroluminescent device comprising at least one pair of electrodes, and aluminescing layer held between said electrodes, wherein said luminescing layer comprises an ultrafine particle film formed by deposition of ultrafine particles.

DETAILED DESCRIPTION OF THE PREFERRED EMBODIMENTS

Figure 1:
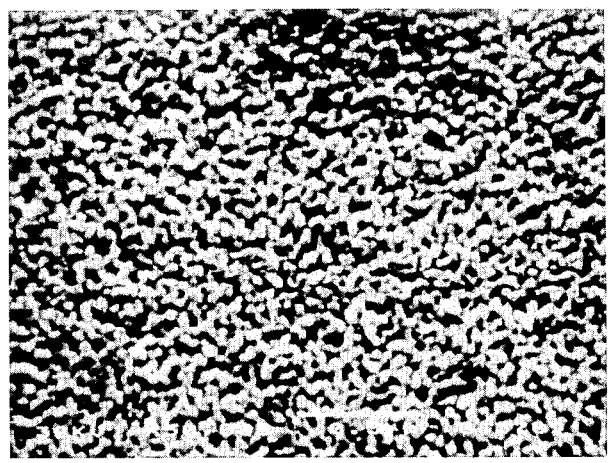
FIG. 1 is a view showing the structure of an ultrafine particle film according to the present invention.

The luminescing member of the present invention comprises an ultrafine particle film in which a luminescing part comprises ultrafine particles deposited in a layer.

The ultrafine particle film mentioned in the present invention refers to a porous deposit film comprising spherical ultrafine particles deposited with their shapes kept unchanged, and is clearly distinguished from uniform films formed by the conventional CVD method, or from films formed by coating a composition obtained by dispersing fine particles in a binder.

Such ultrafine particles may suitably be in the range of from 10 Å to 1,000 Å, preferably from 10 Å to 500 Å, and more preferably from 10 Å to 200 Å, according the TEM observation.

Particularly suitable as the materials that constitute the ultrafine particles according to the present invention are compounds mainly comprised of a Group IV element of the periodic table, preferably Si, C or Ge, and oxygen.

The present invention will be described below
in detail by giving an example where Si is used, which is the most preferred embodiment.

The luminescing part is formed of a film comprising ultrafine particles having a particle size ranging from 20 Å to 150 Å and mainly comprised of amorphous $Si:O_x$ where x ranges from 1.0 to 2.0, more preferably from 1.4 to 2.0.

The ultrafine particle film has a band gap ranging from about 3.0 to 3.5 eV, which is smaller than the band gap 8.9 eV of amorphous $SiO_2$.

The ultrafine particle film also has its emission peak wave length near 590 nm and exhibits a bright orange color. It has an emission peak wavelength shifted to the shorter wavelength side and an emission intensity reaching a two time to 10 time value, as compared with the $a-Si:H_x$ uniform film formed by the HOMOCVD process as previously described.

The emission intensity becomes larger in proportion to the thickness of the ultrafine particle film. If the film thickness is not more than 1 μm, the ultrafine particle film becomes substantially transparent.

The preparation process of the ultrafine particle film according to the present invention will be described later in detail, but the outline thereof can be described as follows: Formed first is a deposit film comprising ultrafine particles mainly comprised of $a-Si:H_x$ containing a large number of $SiH_2$ bonds and having a hydrogen concentration of from 10 at. % to 70 at. %, followed by oxidation of the film to make an ultrafine particle film comprised of $a-Si:O_x$ in which the concentration of Si-bonded hydrogen is 1 at. % or less and the concentration of Si-bonded oxygen is 50 to 67 at. % at maximum. To further improve the emission intensity, it is preferable to carry out the oxidation treatment of the ultrafine particles under the condition of a high humidity (for example, 60° C., 80% RH), or by exposing the ultrafine particles to the high humidity condition after the oxidation.

It is clear why making the raw materials to be used in the present invention into ultrafine particles and oxidizing the same increases the emission intensity. Presumably, changes in physical properties caused by increase in surface area due to bringing of the raw material into ultrafine particles influence an increase in internal quantum efficiency. It may be considered the quantum effect due to near approach of the size of particles to the wavelength of electrons. It may also be considered that a decrease in the reflectance due to making the raw materials into ultrafine particles upon emission of light from the center of the luminescing member has brought about increase in the light takeout efficiency. It may also be considered that, in the case of an ultrafine particle film comprising a luminescing member laminated on a substrate, the light emitted from the surface of the film at its deep part had reached the film surface without undergoing much scattering because of the size of ultrafine particles which is far smaller than the wavelength of the light, and hence it looks as if the emission intensity has apparently increased.

It may be also considered that the emission intensity increases because the oxidation of at least part of the ultrafine particles enables introduction of a large number of impurity levels that can contribute the emission of light.

Figure 2:
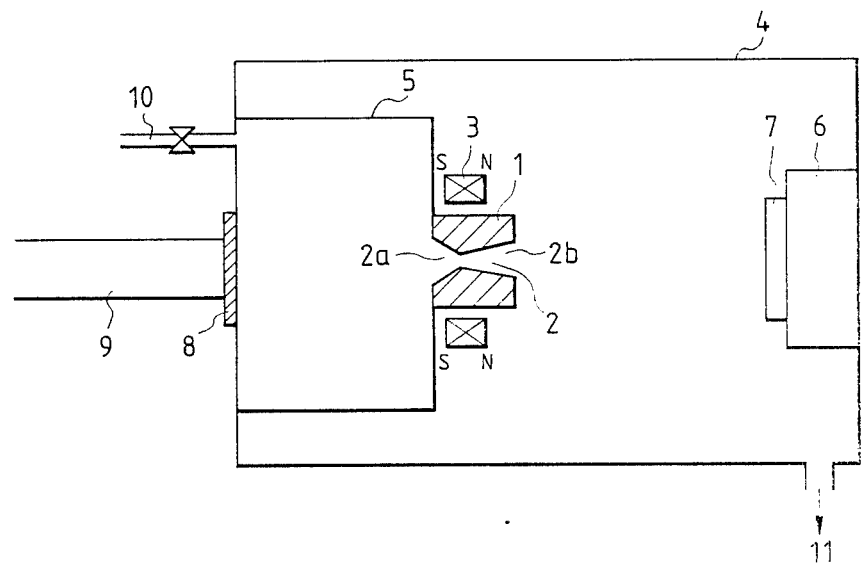
FIG. 2 is a view illustrating an apparatus for preparing an ultrafine particle film.

The apparatus as illustrated in FIG. 2 is used as an apparatus for preparing the luminescing member of the present invention.

In this apparatus, a convergent-divergent nozzle 1 is connected to an end of a cavity resonator 5, and a magnet 3 is provided around the nozzle 1 in the manner that the north pole and south pole thereof are arranged in the axial direction of the nozzle.

Magnet 3 generates a plasma in the vicinity of the nozzle and maintain it stable. The numeral 8 denotes a quartz glass window to introduce microwaves; and 9 denotes a microwave waveguide which guides microwaves generated by a microwave generator (not shown) to the inside of the cavity resonator 5. The numeral 6 denotes a substrate holder, which holds a substrate 7.

An example of preparing the ultrafine particle film comprising amorphous $Si:O_x$ will be described below.

First, a downstream chamber 4 is evacuated to a prescribed pressure by means of an exhaust system 11. Then, $SiH_4$ gas and $H_2$ gas are fed from a gas-introducing pipe 10 thereto, and plasma is generated using microwaves in the cavity resonator 5 to subject the gases to decompose and react, thus forming ultrafine particles.

Usable as means for giving energy to plasma are microwaves, electromagnetic waves such as radiofrequency waves (i.e., ultraviolet rays or RF), and application of electric fields of low frequency or direct current. Most readily usable from the viewpoint of practical use are ultraviolet rays and microwaves. When they are used, although it is necessary to device the shape of the reaction chamber, it is unnecessary to provide structures such as electrodes in the reaction chamber, and it is satisfactory if there is provided a window through which the energy is introduced. Also when the microwave plasma is used, various methods are available, including the method disclosed in Japanese Journal of Applied Physics 21, [8]1470 (1982) ion which a coaxial tube is used and the method published in Journal of Non-Crystalline Solids 77/78, 813 (1985). However, very effective from the standpoint of efficiently achieving the formation of ultrafine particles is the present method in which the reaction chamber is constituted of the cavity resonator of microwaves. This can be realized by making the length l in the axial direction of the cavity resonator to be ½ of the resonance wavelength λ. Comparing the deposition rate in case of $l=\lambda/2$ with that of the case when the length of the cavity resonator is made larger to give $l=\lambda$, there is an upper limit in increase in the deposition rate with increase in the concentration of $SiH_4$ in case of $l=\lambda$, but there is not found such a limit in case of $l=\lambda/2$ to find that the deposition rate linearly increases. If $l>2\lambda$, the deposition rate may become too slow to be of practical use. The length l of the cavity resonator is required to satisfy the requirement of $l\leq 3\lambda/2$. Whether the means for exciting plasma comprises the microwave or other means, the power to be applied was found to influence to a certain degree the emission intensity of the ultrafine particle film deposited on a substrate. To obtain a strong emission, it can be effective that a large power is applied such that the ratio of the emission intensity $I_H$ of the emission near 656 nm of a luminescing species $H_\alpha$ to the emission intensity $I_S$ of the emission near 414 nm of SiH may come to be $I_S/I_H \leq 0.2$. The deposition rate also increases with increase in pressure. If the pressure is made to be 1.0 Torr or more, it is possible to achieve even a high rate deposition of about 1 μ/sec.

The nozzle 1 has functions to blow off the ultrafine particles formed in the upstream chamber (or resonator) 5, in a high velocity together with the remaining gas, and spray and fix them on the substrate 7.

There is no particular limitation in the shape of the nozzle. However, in order to enhance adhesion of the ultrafine particles on the substrate 7 and bring the ultrafine particles into a beam so that they can be collected on the substrate 7 in a high velocity and with a good efficiency, it is desirable to use a supersonic nozzle (or Laval nozzle) having bore variation from the upstream side toward the downstream side, which is of the so-called convergent-divergent type. Its cross-sectional shape may not be limited to a circular form, and there can be used nozzles having variously modified shapes as disclosed in Japanese Unexamined Patent Publication No. 61-221377.

A pressure of the substrate chamber (or downstream chamber) 4 which is at the downstream side of the nozzle 1 may be lowered to $10^{-3}$ Torr or less and the ratio of the pressure of the upstream side and that of downstream side of the nozzle 1 may be so set as to be several ten to several hundred, so that the ultrafine particles formed in the upstream chamber 5 are jetted from the nozzle 1 as a jet flow taking the form of a beam.

As a result, formed on the substrate 7 is the ultrafine particle film on which the ultrafine particles comprising ultrafine particles mainly comprised of a-Si:$H_x$ containing a large number of $SiH_2$ bonds and having a hydrogen concentration of from 10 at. % to 70 at. % are deposited.

To dramatically improve the emission intensity of the ultrafine particle film thus formed, an oxidation treatment is applied to the ultrafine particle film.

Methods for the oxidation of the ultrafine particle film may include the following:

(1) Oxidation in an oxygen atmosphere. More specifically, the film may be left in the air or exposed in an atmosphere in which ozone is present.

(2) Heat treatment in an oxygen atmosphere. Heating in the air enables a more prompt oxidation for enhancement of emission intensity. It is also effective to deposit an aggregate of ultrafine particles on a substrate that may release oxygen by heating.

(3) treatment in an atmosphere in which oxygen plasma is present. This is effective to conduct an oxidation treatment in a shorter time for enhancing the emission intensity.

(4) Treatment in water vapor. This method also enables more efficient enhancement of the emission intensity than the oxidation by heating.

(5) Treatment in water or an aqueous solution such as an aqueous HCl solution. This is effective as a method to enhance the emission intensity like the methods (1) to (4).

(6) Oxygen or an oxygen compound is previously mixed at the time of preparing the ultrafine particles.

Carrying out any of such treatments makes it possible to obtain the ultrafine particle film comprising a-Si:$O_x$ (x=1.0 to 2.0) mainly comprised of Si—O—Si bonds and having a Si-bonded hydrogen concentration of 1 at. % or less and a Si-bonded oxygen concentration of 50 to 67 at. % at maximum.

In particular, the present inventors have found that such an ultrafine particle film may be oxidized under the condition of high humidity as in the treatment (4) or the ultrafine particle film may be exposed to the condition of high humidity after the oxidation treatment, so that Si—OH bonds characterized by absorption approximately at 3,500 $cm^{-1}$ in an IR spectrum can be formed and this promotes the increase in the emission intensity.

In the present invention, raw materials to form the a-Si:$H_x$ ultrafine particles and the corresponding ultrafine particle film may not be limited to $SiH_4$, and its derivative $Si_2H_6$ can be also used.

Incidentally, ultrafine particles of amorphous carbon or an aggregate thereof, as a matter of course, can be formed by using gases containing elements other than Si as exemplified by hydrocarbon gases (such as $CH_4$, $CH_3OH$ and $C_2H_6$) and ultrafine particles of amorphous germanium or an aggregate thereof can be formed by using $GeH_4$ or the like. The films thus formed, like those of a-Si, have not been hitherto considered suitable as luminescing members so long as they are prepared by the conventional glow discharge process or the like. However, the formation of the film in the form of an ultrafine particle structure by the method according to the present invention can provide films that can exhibit emission characteristics with a high intensity like the case of the silicon ultrafine particles.

It was further found that at least one of these gases containing the Group IV element may be mixed in forming the ultrafine particles by the method according to the present invention, so that the composition of the ultrafine particles formed and the optical band gap may change depending on the mixing ratio of the gases and hence the emission wavelength can be readily controlled and the emission intensity is so high. A number of examples are seen in which these alloy films as exemplified by a-SiC or a-SiGe films are formed by glow discharge or sputtering, but usually strong photoluminescence can be observed with difficulty unless they have been formed at a relatively low temperature. The emission intensity thereof is so extremely weak as to be capable of being observed for the first time by use of a lightdetecting device and an amplifier, and thus the effect of the present invention is very significant from the viewpoints of practical use and production techniques.

The ultrafine particle film in the luminescing member of the present invention, comprising the ultrafine particles deposited on the substrate, may be provided on its surface with a protective layer. This protective layer is effective for enhancing the mechanical strength of the ultrafine particle film, and preventing the luminescing layer from being deteriorated because of changes in properties or undergoing other changes. Usable are polystyrene, polycarbonate and other argonic polymers, quarts, inorganic glass such as low-melting glass, or plasma polymerization films of SiN, a-C or the like. The organic polymers are convenient since it is possible to use methods such as solvent coating.

An embodiment in which a luminescing member having such an ultrafine particle film is applied to an EL device will be described below.

Figure 3:
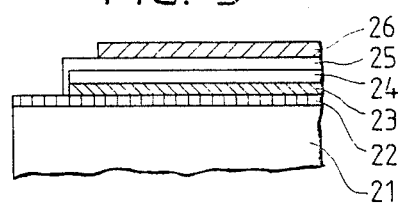
FIG. 3 is a cross-sectional view of an EL device of the present invention.

FIG. 3 is a view illustrating a crosssectional view of the EL device. Light-transmissive electrically insulating materials such as glass, polyester and polycarbonate are used as a substrate 21.

In EL devices having the structure that light is not emitted from the substrate side, opaque plastics can be also used.

A transparent electrode 22 formed on the substrate 21 comprises a ITO vapor-deposited film formed by sputtering or the like film.

A first insulating layer 23 and a second insulating layer 25 are comprised of dielectric materials such as $Si_3N_4$, $Y_2O_3$, $SiO_2$, $SrTiO_3$ and $BaTa_2O_3$ having a large dielectric constant and a large dielectric strength, and can be formed of thin-film deposit layers according to sputtering, CVD, etc. The first insulating layer and the second insulating layer may comprise respectively different materials, or laminated films of plural materials.

An upper electrode 26 made of metallic conductive materials such as Al is formed on the second insulating layer.

A luminescing layer 24 comprises the ultrafine particle film previously described, and may preferably have a thickness of from 0.1 to 3 $\mu$m, more preferably in the range of from 0.2 to 1 $\mu$m.

When the film thickness exceeds 3 $\mu$m, it is necessary to apply a large voltage. On the contrary, when the film thickness is less than 0.1 $\mu$m, dielectric breakdown is liable to occur undesirably.

Effect of the invention

As described above, the luminescing member of the present invention has a very high emission intensity and furthermore can always achieve stable luminescence with almost no changes with time.

The EL device of the present invention can also perform emission of light with a high luminance at a low drive voltage, and can be applied to Schottky junction type EL devices.

The present invention will be specifically described below by the following Examples.

EXAMPLE 1

Using the apparatus illustrated in FIG. 2, an ultrafine particle film 1 was formed on a glass substrate.

The nozzle 1 is made of stainless steel and constructed such that the ratio of the cross-sectional area of nozzle opening 2a to the cross-sectional area of throat 2 is 31 and the ratio of the cross-sectional area of nozzle opening 2b to the cross-sectional area of throat 2 is 7. The cavity resonator 5 is also made of stainless steel and constructed such that its length is ¼ of the resonance wavelength.

In preparing the luminescing member, first the glass substrate 7 is fixed on the holder 6, and thereafter the inside of the downstream chamber 4 was evacuated to $2 \times 10^{-7}$ Torr by means of the exhaust system 11. Then, $SiH_4$ diluted to 3% with $H_2$ gas was flowed from the gas-introducing pipe 10 to the cavity resonator 5 at a flow rate of 100 SCCM. As a result, the pressure inside the cavity resonator 5 came to be $2 \times 10^{-1}$ Torr and the gas was blown off from the nozzle 1 to the downstream chamber 4. At this time, the pressure of the downstream chamber 4 came to be about $4.5 \times 10^{-3}$ Torr. Then, the microwave generator (not shown) was switched on to introduce microwaves from the quartz glass window 8 to the cavity resonator 5 through the microwave waveguide 9, thus generating discharge plasma in the cavity resonator 5. The microwave power was 150 W. As a result, ultrafine particles were formed in the plasma and blown off from the nozzle 1 together with other active species produced by the plasma. The particles advanced through the downstream chamber in the form of a ultrafine particle beam to collide against the substrate 7, and were fixed there. The deposit layer of the ultrafine particles adhered on the substrate had a thickness of 7.5 $\mu$m after discharge for 5 minutes. No heating of the substrate was effected. After deposition of the ultrafine particle film, gas was stopped, the inside of the downstream chamber 4 was thoroughly evacuated, and thereafter the vacuum was leaked, then the film-formed substrate was taken out. The ultrafine particles were deposited on the substrate surface in the form of a film having a brown gloss in appearance, and deposited in the shape of a disc having its center corresponding to the center of the beam. The film thickness at the center is the largest. An SEM (scanning electron microscope) photography (50,000 magnifications) of the resulting ultrafine particle film is shown in FIG. 1. According to the observation by SEM, this film had the structure that ultrafine particles having a relatively uniform particle diameter of about 70 Å are deposited, and it was able to confirm the presence of ultrafine particles not only on the film surface but also on the cross section of the film. According to the observation by SEM, the ultrafine particles appeared to be deposited in a considerably high density. Blue light having a strong wavelength component near 450 nm was irradiated on this film. As a result, vermillion fluorescence was emitted at room temperature, which could be clearly recognized with the naked eye even under a room lamp.

COMPARATIVE EXAMPLE 1

Using the apparatus as illustrated in FIG. 2, film formation was carried out on a glass substrate following the procedures as in Example 1. In that occasion, the substrate holder 6 was not heated, $SiH_4$ diluted to 5% with $H_2$ was used as a raw material gas, and the gas flow rate was set at 7 SCCM. At this time, the pressure inside the cavity resonator 5 was about $5 \times 10^{-2}$ Torr and the pressure of the downstream chamber 4 was $3 \times 10^{-4}$ Torr. The power to introduce microwaves was set at 500 W to generate plasma inside the cavity resonator 5, thus carrying out film formation. As a result, a film was formed on the substrate. According to observation by SEM after the film formation, the structure that the ultrafine particles are deposited as seen in Example 1' was not seen at all either on the surface or on the cross section of the film, and it could be confirmed that it comprised a uniform layer. Blue light having strong wavelength components near 450 nm was irradiated on this film is the same manner as in Example 1. As a result, no fluorescence of any color could be recognized with the naked eye even in a dark room.

EXAMPLE 2

Using the apparatus as illustrated in FIG. 2, film formation was carried out on a glass substrate following the procedures as in Example 1. In that occasion, the substrate holder 6 was not heated, and the gas flow rate was set at 200 SCCM. At this time, the pressure inside the cavity resonator 5 was about $5.8 \times 10^{-1}$ Torr and the pressure of the downstream chamber 4 was $1.0 \times 10^{-2}$ Torr. The power to introduce microwaves was set at 150 W to carry out the film formation in the same manner as in Example 1. As a result, a film was formed on the glass substrate 7. There could be formed a film of 6 μm thick after film formation for about 5 minutes. The resulting film was taken out from the apparatus together with the substrate, and observed by SEM to reveal that there was formed an ultrafine particle film having the structure that ultrafine particles having a particle diameter of about 150 Å are deposited. The blue light similar to that in Example 1 was irradiated thereon. As a result, although no fluorescence could be recognized under a room lamp, slight red luminescence could be recognized in a dark room.

EXAMPLE 3

Using the apparatus as illustrated in FIG. 2, film formation was carried out on a glass substrate following the procedures as in Example 1. Used as a raw material was a mixed gas of $CH_4/H_2(1/10)$, and the gas flow rate was set at 100 SCCM. At this time, the pressure inside the cavity resonator 5 was about $8 \times 10^{-2}$ Torr. The power to introduce microwaves was set at 250 W to generate plasma inside the cavity resonator 5 to carry out the film formation. As a result, a film was formed on the substrate. Observation by SEM revealed that the resulting film comprised an ultrafine particle film on which ultrafine particles having a particle diameter of about 60 Å were deposited, and white luminescence was recognized under irradiation of light from a xenon lamp. In contrast thereto, carrying out film formation by setting the pressure inside the cavity resonator 5 at $5 \times 10^{-2}$ Torr and setting the microwave power to 500 W resulted in formation of a uniform film, and there was recognized no structure of ultrafine particles. No fluorescence was recognized even if the light from a xenon lamp was irradiated on it.

EXAMPLE 4

Figure 4A:
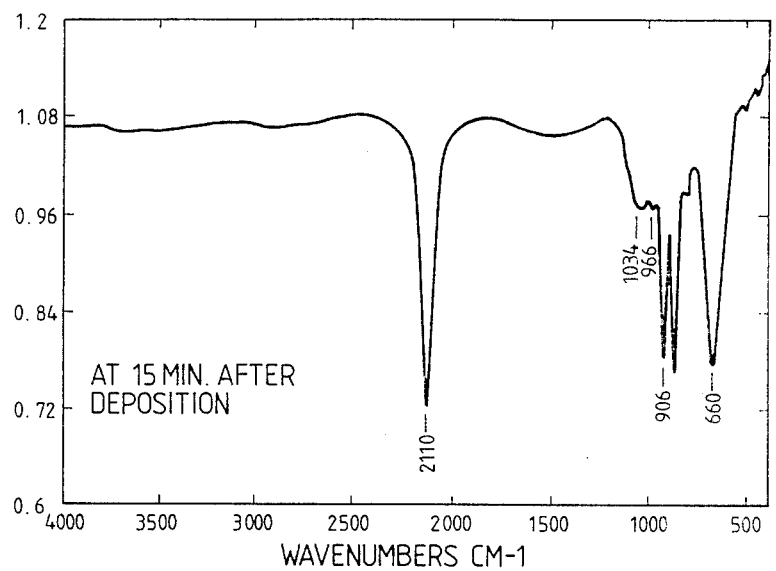
FIGS. 4A and 4B are views showing FT.IR absorption spectra of an ultrafine particle film.

The ultrafine particle film obtained in Example 1 was taken out in the air, followed immediately by FT-IR measurement to obtain the results as shown in FIG. 4A. A sharp peak is seen near 2,100 cm$^{-1}$, showing that the film is rich in $SiH_2$. Also, an Ar ion laser beam (488 nm) was irradiated on this ultrafine particle film. As a result, red photoluminescence (PL) was observed at room temperature.

Figure 4B:
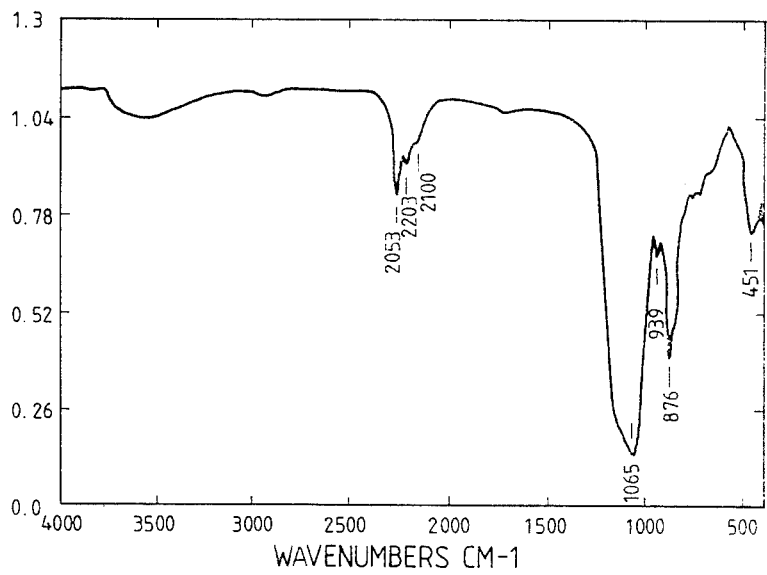

This ultrafine particle film was further left in the air for 2 weeks, followed by FT-IR measurement to obtain the results as shown in FIG. 4B. It is seen that oxidation has progressed to a considerable extent as compared with the results shown in FIG. 4A and, in particular, the peak near 2,250 cm$^{-1}$ has become larger than the peak at 2,100 cm$^{-1}$. With progress of the oxidation, the peak attributable to Si-Si bonds near 515 cm$^{-1}$ or near 480 cm$^{-1}$ comes not to appear at all in the Raman spectroscopic analysis. As will be seen from the instance of the present Example, it is considered that the incorporated oxygen is mainly in the form of Si-O-Si or Si-O-OH, and may be partly mixed with Si=O or

Figure 5:
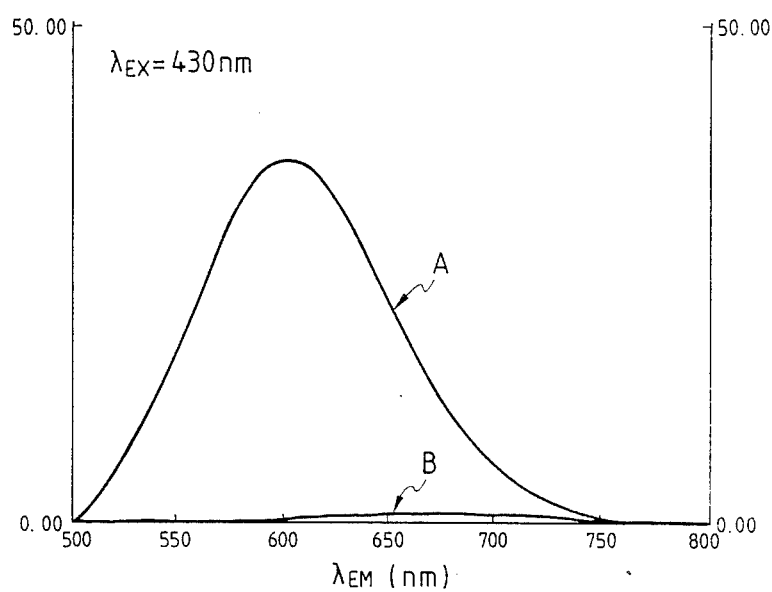
FIG. 5 is a view showing a fluorescence spectrum of an ultrafine particle film.

Blue light of 430 nm obtained from light of a xenon lamp through a monochromator was irradiated on the sample left in the air. As a result, vermilion luminescence was observed at room temperature, which could be clearly recognized with the naked eye even under a room lamp. The fluorescence spectrum observed at this time is shown by A in FIG. 5. The emission intensity has increased as much as 350 times with respect to the initial ultrafine particle film B.

COMPARATIVE EXAMPLE 2

Figure 6:
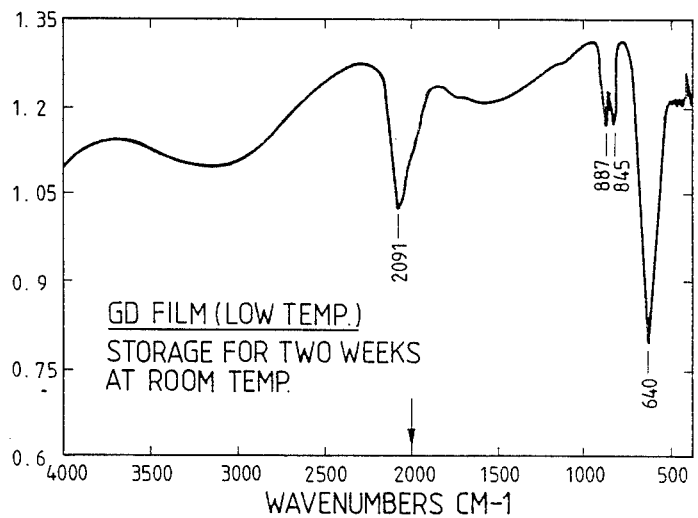
FIG. 6 is a view showing a FT.IR absorption spectrum of a uniform film formed by glow discharge.
Figure 7:
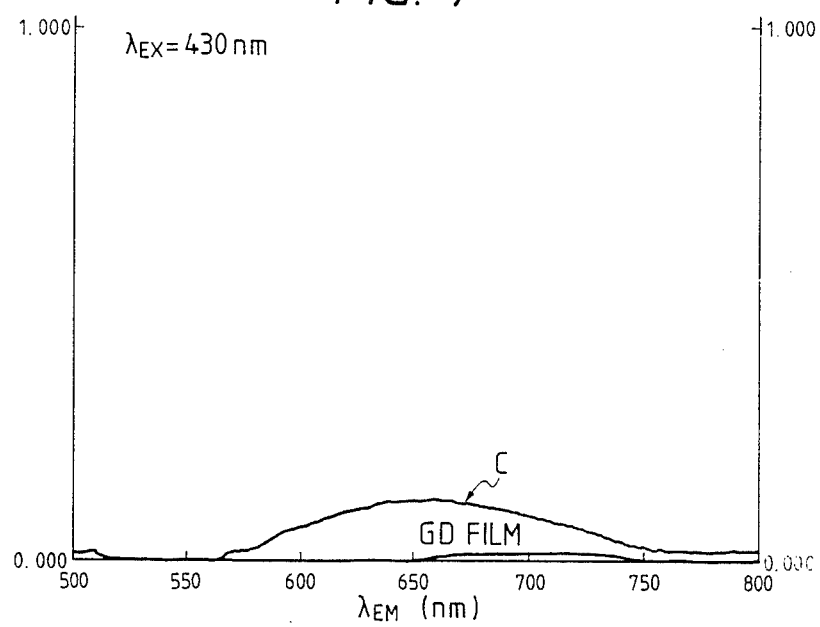
FIG. 7 is a view showing a fluorescence spectrum of a uniform film formed by glow discharge.

According to a conventional glow discharge (GD) process, a uniform film comprising —SiH$_2$ was prepared using Si$_2$H$_6$ and H$_2$ under the condition that the substrate was water-cooled. This uniform film was also left in the air for 2 weeks, where FT-IR measurement was carried out to obtain the results as shown in FIG. 6. Oxidation is little observed. This sample was similarly excited using light of 430 nm (−2.5 nm) from a xenon lamp to obtain a fluorescence spectrum as shown by C in FIG. 7. Even when compared with the ultrafine particle film which was in the initial state in Example 1, the emission intensity was 1/15.

EXAMPLE 5

Figure 8:
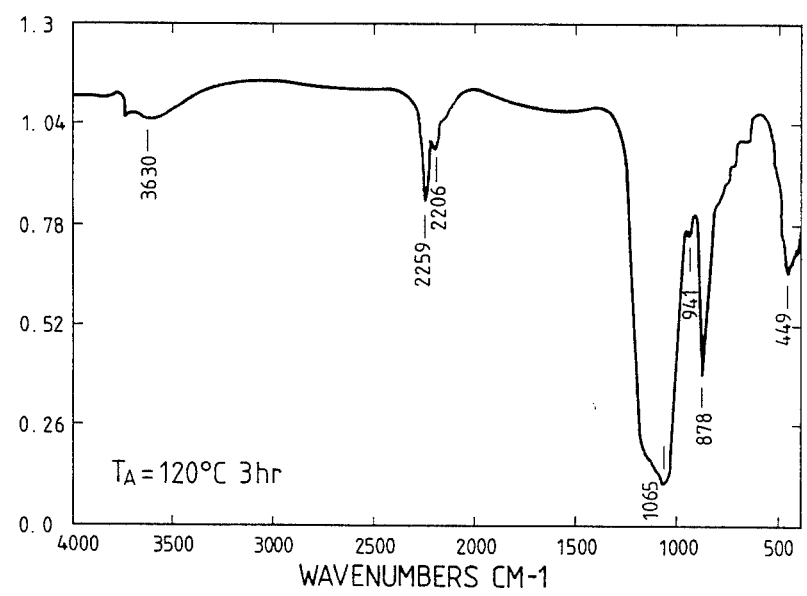
FIG. 8 to FIG. 10 are views showing FT.IR absorption spectra of ultrafine particle films.

The ultrafine particle film obtained in Example 1 was heated to 120° C. in the air, and FT-IR measurement was carried out after 3 hours to obtain the results shown in FIG. 8. Light from xenon lamp, spectrally selected to 430 nm in the same manner as in Example 4, was irradiated on this sample. As a result, the emission intensity increased as much as 270 times with respect to the initial ultrafine particle film.

EXAMPLE 6

Figure 9:
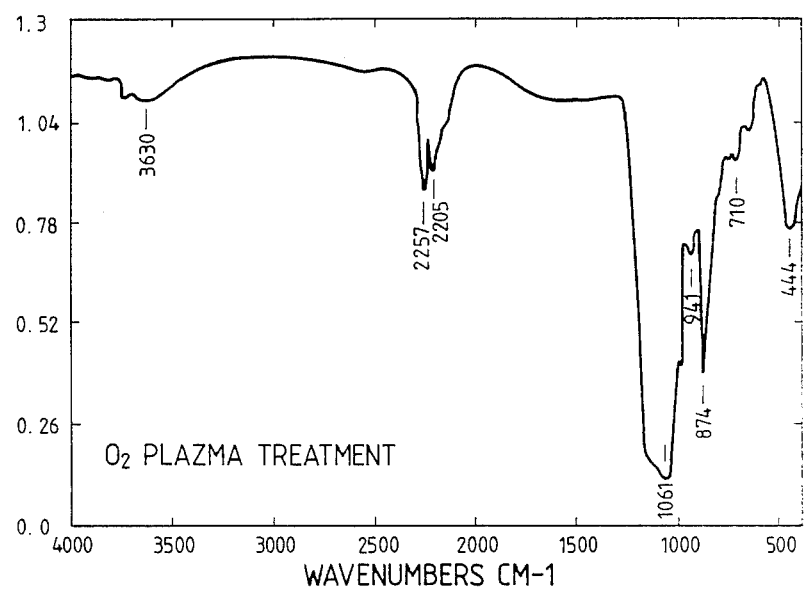

The ultrafine particle film obtained in Example 1 was treated in oxygen plasma for 5 minutes. FT-IR measurement was carried out on the resulting sample to obtain the results shown in FIG. 9. Light from a xenon lamp, spectrally selected to 430 nm in the same manner as in Example 4, was irradiated on this sample. As a result, the emission intensity increased as much as 300 times with respect to the initial ultrafine particle film.

EXAMPLE 7

Figure 10:
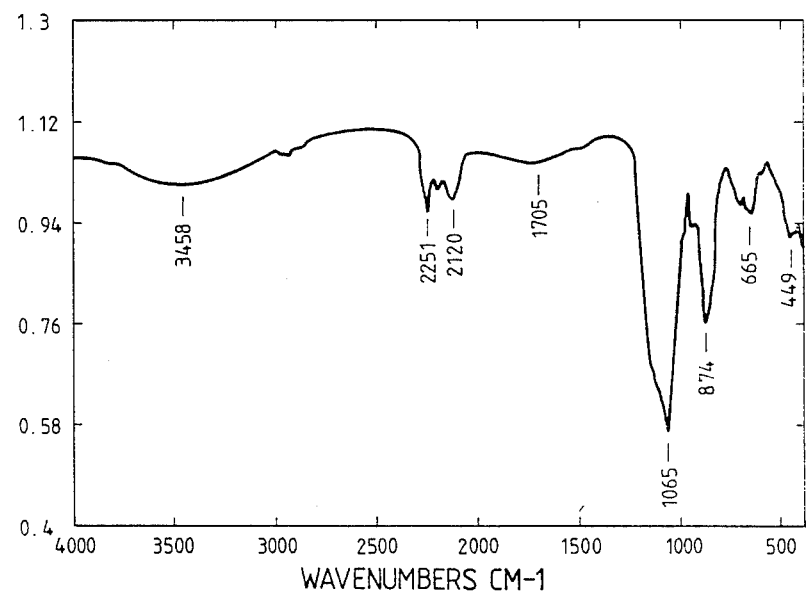
Figure 11:
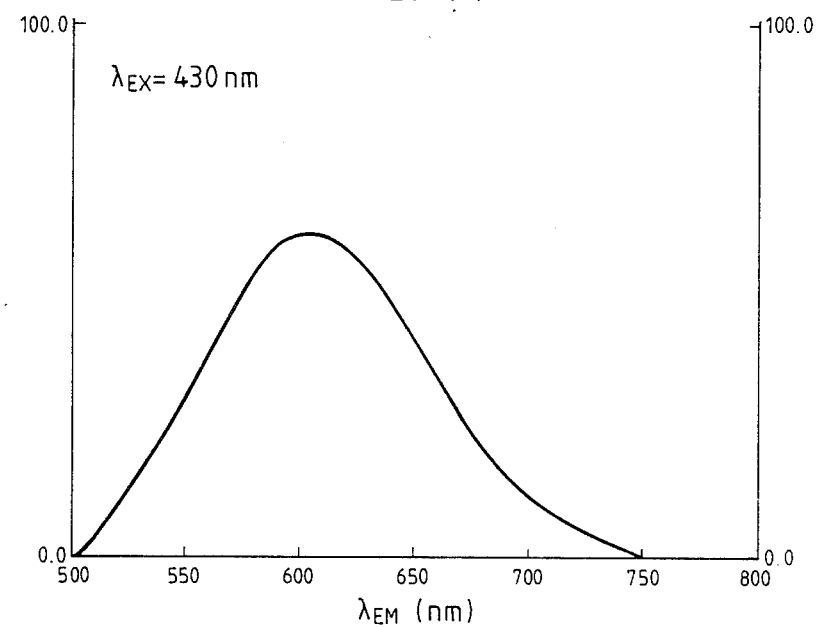
FIG. 11 is a view showing a fluorescence spectrum of an ultrafine particle film.

The ultrafine particle film obtained in Example 1 was exposed to water vapor at 90° C. using a thermo-hygrostat for 1 hour. FT-IR measurement was carried out on the resulting sample to obtain the results shown in FIG. 10. In this instance also, the peak intensity at 2,250 cm$^{-1}$ became larger than the peak intensity at 2,100 cm$^{-1}$. Light from a xenon lamp, spectrally selected to 430 nm in the same manner as in Example 4, was irradiated on this sample to obtain the fluorescence spectrum as shown in FIG. 11. Here, the emission intensity increased as much as 590 times with respect to the initial ultrafine particle film.

EXAMPLE 8

Figure 12:
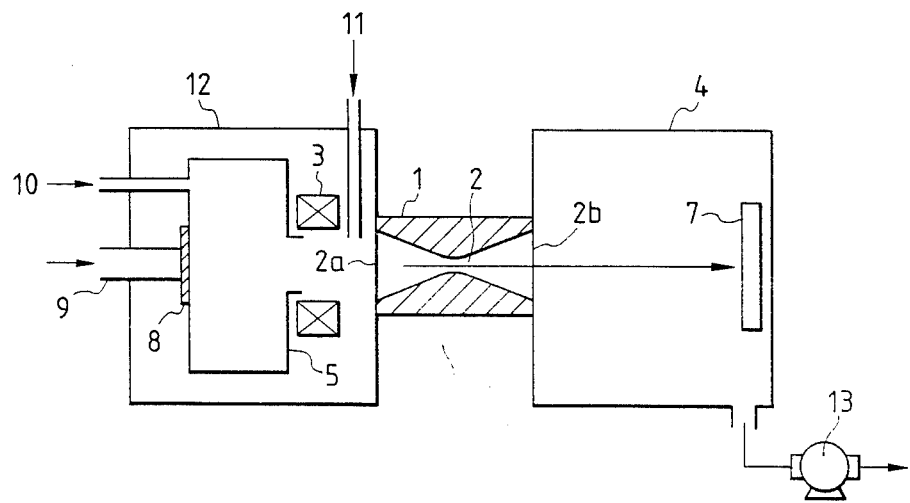
FIG. 12 is a view illustrating another apparatus for preparing an ultrafine particle film.

Using the apparatus shown in FIG. 12, oxidized a-Si:$H_x$ ultrafine particles were deposited on a silicon wafer according to procedures as in Example 1. At this time, $N_2O$ gas was introduced from a gasintroducing pipe 11 in an upstream chamber 12 at a flow rate of 1 SCCM. $SiH_4$ gas diluted to 3% with $H_2$ gas was also flowed from a gas-introducing pipe 10 in a cavity resonator 5 at a flow rate of 100 SCCM. A microwave power of 150 W was further applied to the cavity resonator to generate discharge plasma. The discharge plasma was observed by OES (optical emission spectroscopy). As a result, luminescence of oxygen plasma was recognized in the vicinity of the center of a magnetic coil 3. The layer of the deposit of ultrafine particles adhered on a substrate 7 had a thickness of 6 μm after discharge for 5 minutes.

Figure 13:
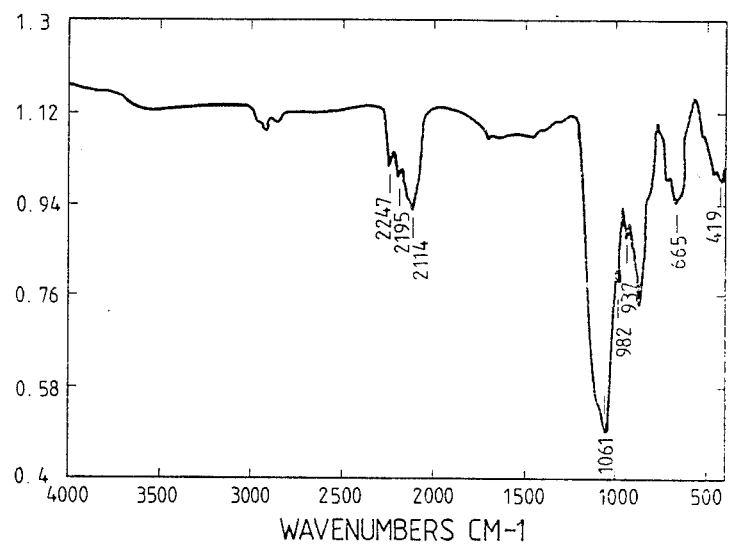
FIG. 13 is a view showing a FT.IR absorption spectrum of an ultrafine particle film.

The deposit was yellowish white, and was a glossy, filmy deposit. FT-IR measurement was carried out on this ultrafine particle deposit film to obtain the results shown in FIG. 13. Also, light from a xenon lamp, spectrally selected to 430 nm, was irradiated on this sample to find that the emission intensity was 120 times with respect to the initial ultrafine particle film of Example 1. Thus, it was found that the effect of increasing the emission intensity was exhibited also when the oxidation was not effected after preparation of the ultrafine particle film but before deposition of the ultrafine particles.

EXAMPLE 9

Prepared was an EL device as shown in FIG. 3.

On a glass substrate, a transparent electrode comprising ITO and a first insulating layer comprising $Si_3N_4$ were formed according to sputtering and CVD, respectively. The ITO had a 0.2 μm thickness and the first insulating layer had a 0.3 μm thickness according to sputtering and CVD, respectively. Using the ultrafine particle formation apparatus shown in FIG. 2, formed thereon was an ultrafine particle film with a 0.25 μm thickness by using as a raw material gas a mixed gas obtained by diluting $SiH_4$ to 3% with $H_2$. This ultrafine particle film was formed under the conditions that the microwave power was 150 W, the pressure in the cavity resonator was 0.4 Torr, and the presssure of the downstream chamber was 4.5 Torr. The gas flow rate at this time was about 100 SCCM. Also, the substrate holder on which the glass substrate was fixed was cooled with water. The ultrafine particles thus formed had a particle diameter ranging from 100 to 200 Å. As a result of an infrared spectral analysis, a strong peak was seen at 2,090 $cm^{-1}$, and this ultrafine particles are presumed to be mainly comprised of $SiH_2$. The device prepared according to the above preparation process was subjected to oxidation treatment at 100° C. for 3 hours, and thereafter a 0.3 μm thick second insulating layer comprising $Si_3N_4$ and a 0.5 μm thick upper electrode comprising Al were laminated thereon to prepare an EL device.

For comparison, prepared was an EL device comprising the same materials and constitution as the above except that the luminescing layer was replaced with an a-SiC uniform film formed by a CVD process. The surface of the resulting SiC film was observed with FE-SEM, but there was seen no ultrafine particle structure.

Figure 14:
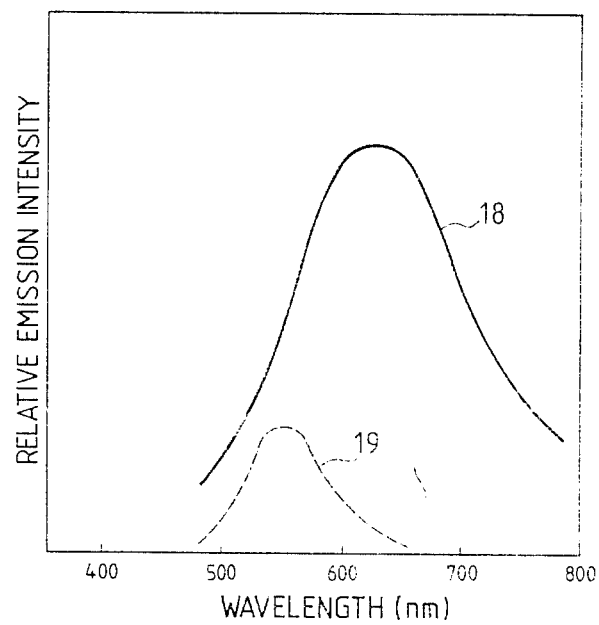
FIG. 14 is a view showing luminescence spectra of EL devices.

Luminescence spectra obtained when the EL device of the present Example and the EL device of the comparative example were driven at 1 kHz are shown in FIG. 14.

As shown in FIG. 14, the EL device of the present invention is seen to have a remarkably greater emission intensity than the device of the comparative example.

EXAMPLE 10

An EL device was prepared using the same materials and preparation process as in Example 9 except that a gas obtained by mixing $SiH_4$ and $CH_4$ in 1:1 ratio was used as a raw material gas for the formation of the luminescing layer. The resulting EL device also brightly emitted light like the device of Example 9, but emitted nearly white light with the peak wavelength shifted to a shorter wavelength side than that in Example 9.

EXAMPLE 11

Prepared was an EL device having the same constitution as in Example 9 except that a gas obtained by mixing $SiH_4$ and $CH_4$ in 2:1 ratio was used as a raw material gas for the formation of the luminescing layer. The resulting EL device also brightly emitted light like the device of Example 9, but emitted red light with the peak wavelength shifted to the longer wavelength side than that in Example 9.

EXAMPLE 12

Using 7059 glass as a substrate, ultrafine particle films were formed thereon using the apparatus illustrated in FIG. 2, where the a-SiC ultrafine particles were prepared by introducing a mixed gas of $SiH_4$, $CH_4$ and $H_2$ from the pipe 10 and selecting its flow rate ratio in three ways as shown in Table 1. The microwave power applied was set at 100 W in all instances. The film thickness was controlled to about 1 μm in all instances.

On each sample of the a-SiC ultrafine particle aggregates thus prepared, an argon laser beam having a wavelength of 488 nm were irradiated at room temperature to observe photoluminescence. The spectra of photoluminescence had a broad shape, but had an emission intensity strong enough for the luminescence to be visually recognized. Luminescent color of each sample is shown in Table 1.

Thus, suitable additive elements may be introduced when the ultrafine particle aggregate is made to constitute the luminescing member, so that its luminescence wavelength can be readily controlled. Moreover, the addition of such suitable elements may not cause impairment of the emission intensity achieved when the ultrafine particle aggregate of the original simple metal material was made to constitute the luminescing member, and it is possible to control luminescence wavelength regions while keeping sufficient emission intensity is maintained.

For preparing the a-SiC ultrafine particles, the type of the mixed gas introduced from the pipe 10 may not be limited to the combination of $SiH_4$, $CH_4$ and $H_2$. That is to say, it is of course also possible to use $Si(CH_3)_4$, $C_2H_6$, etc. for the introduction of carbon. It is still also possible to use $Si_2H_6$ in place of $SiH_4$, and the preparation conditions such as the flow rate ratio and the power of microwaves may be made optimum, so that the a-SiC ultrafine particles showing the strong emission intensity like that shown in the present Example can be formed.

EXAMPLE 13

Using 7059 glass as substrates, ultrafine particle films were formed on the substrate by using the apparatus illustrated in FIG. 2, where a-SiC ultrafine particle aggregates were respectively prepared by introducing a mixed gas of $SiH_4$, $GeH_4$ and $H_2$ from the gas-introducing pipe 10 and selecting its flow rate ratio in three ways as shown in Table 2. The microwave power applied in the preparation was set to 100 W, and the ultrafine particle aggregates thus prepared had a thickness of about 1 μm in all instances.

On each sample of the a-SiC ultrafine particle aggregates thus prepared, an argon laser beam having a wavelength of 488 nm was irradiated at room temperature to observe its photoluminescence. Each sample showed a strong emission intensity like that in Example 12. Further the samples containing $GeH_4$ in a largest amount showed an intensity seemingly decreased as compared with other sample as far as it was visually observed, because of the spectral peaks included in the infrared region, but it was confirmed as a result of measurement with a spectrophotometer that the peak intensity was not inferior to the other sample. Colors of the photoluminescence are shown in Table 2.

It was confirmed that the luminescence wavelength region was shifted to its long wavelength side by introducing germanium, on the contrary to the fact that in Example 12 the luminescence wavelength could be shifted to the short wavelength side by introducing carbon. Also, the addition of germanium may not cause impairment of the emission intensity achieved when the ultrafine particle aggregate of the original simple metal material was made to constitute the luminescing member, and it is possible to control luminescence wavelength regions while keeping sufficient emission intensity is maintained.

TABLE 1

| Gas flow rate (SCCM) | | | Compositional ratio of ultra-fine particles* | Color of photoluminescence |
|---|---|---|---|---|
| $SiH_4$ | $CH_4$ | $H_2$ | $Si_xC_{1-x}$ | |
| 1 | 4 | 100 | 0.6 | Near to white light |
| 1 | 2 | 100 | 0.7 | Pale red |
| 2 | 2 | 100 | 0.8 | Vermilion |

TABLE 2

| Gas flow rate (SCCM) | | | Compositional ratio of ultra-fine particles* | Color of photoluminescence |
|---|---|---|---|---|
| $SiH_4$ | $GeH_4$ | $H_2$ | $Si_xGe_{1-x}$ | |
| 2 | 0.5 | 100 | 0.7 | Red |
| 2 | 1 | 100 | 0.5 | Crimson |
| 1 | 1 | 100 | 0.4 | Crimson (with weak intensity) |

*The compositional ratio of each sample was analyzed according to EPMA.

We claim:

1. A luminescent member which emits light upon application of excitation energy thereto, having a luminescing part comprising an ultrafine particle film formed by deposition of ultrafine particles containing at least one element selected from the group consisting of Si, C and Ge.

2. The luminescent member of claim 1, wherein said ultrafine particle film is porous.

3. The luminescent member of claim 1, wherein said ultrafine particles have a size ranging from 10 to 1,000 Å.

4. The luminescent member of claim 1, wherein said ultrafine particles have a size ranging from 10 to 500 Å.

5. The luminescent member of claim 1, wherein said ultrafine particles have a size ranging from 10 to 200 Å.

6. The luminescent member of claim 1, wherein said ultrafine particle film has a band gap ranging from 3.0 to 3.5 eV.

7. The luminescent member according to claim 1, wherein said luminescent part is transparent.

8. A luminescent member which emits light upon application of excitation energy thereto, having a luminescing part comprising ultrafine particles, said ultrafine particles comprising an amorphous $A:O_x$, wherein A is at least one element selected from the group consisting of Si, C and Ge and X represents a numerical value ranging from 1 to 2.

9. The luminescent member of claim 8, wherein X represents a numerical value ranging from 1.4 to 2.

10. The luminescent member of claim 8, wherein the concentration of the hydrogen bonded to said A is not more than 1 atom %.

11. The luminescent member of claim 8, wherein said ultrafine particles have a size ranging from 10 to 1,000 Å.

12. The luminescent member of claim 8, wherein said ultrafine particles have a size ranging from 10 to 500 Å.

13. The luminescent member of claim 8, wherein said ultrafine particles have a size ranging from 10 to 200 Å.

14. The luminescent member according to claim 8, wherein said luminescent part is transparent.

15. A luminescent member that emits light as a result of application of excitation energy thereto, wherein a luminescing part comprises ultrafine particles comprising an amorphous A:O:H having an A—O—A bond and an A—OH bond, and said element A is at least one element selected from the group consisting of Si, C and Ge.

16. The luminescent member of claim 15, wherein the concentration of the oxygen bonded to said A is in the range of from 50 to 67 atom %.

17. The luminescent member of claim 15, wherein the concentration of the hydrogen bonded to said A is not more than 1 atom %.

18. The luminescent member of claim 15, wherein said ultrafine particles has a size ranging from 10 to 1,000 Å.

19. The luminescent member of claim 15, wherein said ultrafine particles has a size ranging from 10 to 500 Å.

20. The luminescent member of claim 15, wherein said ultrafine particles has a size ranging from 10 to 200 Å.

21. The luminescent member according to claim 15, wherein said luminescent part is transparent.

22. A process for preparing a luminescent member comprising the steps of:
    forming ultrafine particles comprising an amorphous $A:H_x$ containing a large number of $AH_2$ bonds; and
    oxidizing said ultrafine particles, wherein A is at least one element selected from the group consisting of Si, C and Ge.

23. The luminescent member of claim 22, wherein the concentration of the hydrogen contained in said amorphous $A:H_x$ is in the range of from 10 to 70 atom %.

24. The luminescent member of claim 22, wherein said oxidation is carried out under the condition of a high humidity.

25. The process of claim 22, wherein said ultrafine particles has a size ranging from 10 to 1,000 Å.

26. The process of claim 22, wherein said ultrafine particles has a size ranging from 10 to 500 Å.

27. The process of claim 22, wherein said ultrafine particles has a size ranging from 10 to 200 Å.

28. The process according to claim 22, wherein said luminescent member is transparent.

29. A process for preparing a luminescing member, comprising the steps of subjecting a gas containing hydrogenated silicon to a discharge plasma treatment to form ultrafine particles containing silicon, blowing a gas containing said ultrafine particles on a substrate through a nozzle to form on the substrate a deposit film comprising the ultrafine particles, and oxidizing said deposit film under the condition of a high humidity.

30. The process of claim 29, wherein said hydrogenated silicon is silane.

31. The process of claim 29, wherein said ultrafine particles has a size ranging from 10 to 1,000 Å.

32. The process of claim 29, wherein said nozzle is a Laval nozzle.

33. The process of claim 29, wherein said deposit film is porous.

34. The process to claim 29, wherein said luminescent member is transparent.

35. An electroluminescent device comprising: at least one pair of electrodes, and a luminescent layer held between said electrodes, wherein said luminescent layer comprises an ultrafine particle film formed by deposition of ultrafine particles, said ultrafine particles containing at least one element selected from the group consisting of Si, C and Ge.

36. The electroluminescent device of claim 35, wherein said ultrafine particle film is porous.

37. The electroluminescent device according to claim 35, wherein said ultrafine particles have a size ranging from 10 to 1,000 Å.

38. The electroluminescent device according to claim 35, wherein said ultrafine particles have a size ranging from 10 to 500 Å.

39. The luminescent device according to claim 35, wherein said ultrafine particles have a size ranging from 10 to 200 Å.

40. The electroluminescent device according to claim 35, wherein said ultrafine particle film has a band gap ranging from 3.0 to 3.5 eV.

41. The electroluminescent device according to claim 35, wherein said ultrafine particles comprise amorphous $A:O_x$, wherein x is in the range of from 1 to 2.

42. The electroluminescent device according to claim 41, wherein x represents a numerical value ranging from 1.5 to 2.

43. The electroluminescent device according to claim 41, wherein the concentration of the hydrogen bonded to said A is not more than 1 atom %.

44. The electroluminescent device according to claim 41, wherein said ultrafine particles have a size ranging from 10 to 1,000 Å.

45. The electroluminescent device according to claim 41, wherein said ultrafine particles have a size ranging from 10 to 500 Å.

46. The electroluminescent device according to claim 41, wherein said ultrafine particles have a size ranging from 10 to 200 Å.

47. The electroluminescent device according to claim 35, wherein said luminescent layer has a thickness of from 0.1 to 3 microns.

48. The electroluminescent device according to claim 35, wherein the luminescent layer has a thickness of from 0.2 to 1 microns.

49. The electroluminescent device according to claim 35, wherein said luminescent layer is transparent.

* * * * *